United States Patent [19]
Fang

[11] 3,983,419
[45] Sept. 28, 1976

[54] ANALOG WAVEFORM TRANSDUCING CIRCUIT

[75] Inventor: Frank F. Fang, Yorktown Heights, N.Y.

[73] Assignee: International Business Machines - IBM, Yorktown Heights, N.Y.

[22] Filed: Dec. 31, 1974

[21] Appl. No.: 537,803

[52] U.S. Cl. .............................. 307/277; 307/235 C; 307/235 W; 307/306; 340/347 AD; 357/5
[51] Int. Cl.² .................... H03K 3/38; G11C 27/02; G08C 9/00
[58] Field of Search ........... 307/212, 277, 245, 306, 307/235 R, 235 C, 235 W; 357/5; 340/347 AD

[56] References Cited
UNITED STATES PATENTS

| | | | |
|---|---|---|---|
| 3,573,662 | 4/1971 | Fulton | 307/306 X |
| 3,879,715 | 4/1975 | Zappe | 307/306 X |
| 3,891,864 | 6/1975 | Gueret | 357/5 X |

*Primary Examiner*—John Zazworsky
*Attorney, Agent, or Firm*—Pollock, Vande Sande & Priddy

[57] ABSTRACT

An analog waveform transducing circuit is disclosed which includes a pair of superconductive circuits connected in parallel between a pair of terminals. One of these circuits includes a Josephson tunnelling device and the other includes inductance (which may be distributed) which is greater than the inductance of the Josephson device. An analog signal is applied to one of said terminals. Means are provided for switching said Josephson device between normal and superconductive states to thereby trap one or more flux quanta. An output means is coupled to one of the two circuits.

In one embodiment the means for switching the Josephson device responds to the analog signal level only, that is the control current is fixed (or zero). In this embodiment a number of pulses may be produced which can be related to the signal level, so that the circuit is an analog to digital converter.

In another embodiment the means for switching said Josephson device includes a control means which normally results in said Josephson device being in a resistive state so that substantially all of said analog signal flows in said second circuit. When the means for switching switches the Josephson device to the superconductive state the second circuit will pass a portion of the analog signal equal to the analog signal flowing therein prior to the switching of the Josephson device. That portion of the analog signal reflecting variations in the analog signal subsequent to switching will flow in the first circuit. This condition will persist for so long as the Josephson device remains in the superconductive state. Substantially all the analog signal will again flow in the second circuit after the Josephson device is again switched to the normal state by the means for switching. This embodiment performs a sample and hold function in that the analog signal level at the time of switching is maintained in the second circuit regardless of variations (within proper limits) of the analog signal level. The current flowing in the second circuit may then be measured by any utilization means to measure the analog signal level at the time of switching.

22 Claims, 7 Drawing Figures

ANALOG WAVEFORM TRANSDUCING CIRCUIT

GOVERNMENT RIGHTS

The United States Government may practice, for governmental purposes, the invention claimed herein without payment of any royalties thereon.

FIELD OF THE INVENTION

The invention relates to analog transducing circuits for performing sample and hold functions and analog to digital conversion.

BACKGROUND OF THE INVENTION

The present invention makes use of devices capable of supporting Josephson tunnelling currents. The basic theoretical explanation of the Josephson effect is given in an article "Possible New Effect in Superconductive Tunnelling" by B. B. Josephson, published in "Physics Letters", July 1962, pp. 251–53. Since then numerous other prior art references disclosing Josephson devices and proposing their application have been published. Only those that are most pertinent are considered here.

The application of Josephson devices to memories is taught in "NDRO Memory Cell Employing a Single Josephson Tunnelling Gate" by W. Henkels appearing in the IBM Technical Disclosure Bulletin, Vol. 15, No. 9, February 1973, pp. 2904–05 and in "Super Conducting Memory Cell" U.S. Application, Ser. No. 399,014 by Gueret, filed Sept. 20, 1973 and assigned to the assignee of this application. Both of the recited references disclose superconductive memory cells which can be visualized as comprised by a pair of superconductive circuits, one of which includes a Josephson device therein. In Henkels the other superconductive circuit has an inductance which is equal to the inductance of the Josephson device. On the other hand, Gueret discloses a memory cell in which the inductance of the Josephson device is smaller than the inductance of the other circuit comprising the cell.

Zappe, in U.S. Pat. No. 3,764,905, discloses "Apparatus for Measuring Pulsed Signals Using Josephson Tunnelling Devices". Zappe discloses a superconducting loop with a Josephson tunnelling device located adjacent a single line along which travels a waveform to be measured. Magnetic flux from the waveform intercepts the loop in an amount which is dependent upon the amplitude of the waveform at any instant of time. A control means is arranged to switch the Josephson device to its superconductive state at the time the waveform is to be sampled. A test Josephson device located adjacent the superconducting loop can be provided to detect the amount of flux trapped in the loop.

Richards, in U.S. Pat. No. 3,362,018 discloses "Electric Circuit Including Superconductive Storage Elements". Richards does not disclose Josephson devices, but instead, he discloses the use of cryotons. More particularly, he discloses that a current traversing a conductor which forms aa portion of a loop may be trapped within the loop if that conductor includes an element which can be made resistive in nature while the remaining portion of the loop is superconductive. In Richards current will be shunted into the superconducting portion of the loop when the element in the conductor becomes resistive. Subsequently, if the element in the conductor is again caused to become superconductive and the current through the conductor is terminated, a circulating current will be set up through the loop whose amplitude is consistent with the magnetic field enclosed in the loop due to the original current in the conductor.

Clarke et al. in "Super Conducting Memory Device Using Josephson Junctions" appearing in Electronics Letters, May 1967, Vol. 3, No. 5 at pp. 178–79 discloses modifying the Richards device by replacing Richards' cryotron with a Josephson junction.

Crowe, in U.S. Pat. No. 2,949,602 discloses a Cryogenic Converter. More particularly, he discloses a cryogenic device which comprises a cryogenic circuit including a loop with both hard and soft superconductors maintained in a liquid helium bath. A drive coil is inductively coupled to the hard superconductor and the soft superconductor is coupled to a sense winding. As the drive current is increased flux linkages occur which induce a circulating current in the loop. No flux penetrates the loop however until the loop current reaches and exceeds the critical current of the soft superconductor which switches to the resistive state. The circulating current is then dissipated in $I^2R$ losses. However when the soft superconductor switches its magnetic field collapses which can be sensed in the sense winding. In this fashion an output pulse is produced each time the circulating current exceeds the critical current of the soft superconductor, or a multiple thereof. The number of pulses can be related to the current level in the drive coil to perform an A/D conversion.

The Henkels and Gueret references are directed at digital memory devices, i.e., devices which are adapted to store the presence or absence of a specified signal. The Zappe reference is adapted to perform a sample and hold function although it will be appreciated that the Zappe device is particularly adapted to perform a sampling and holding function on repetitive waveforms, particularly of short duration. Thus, in the Zappe disclosure the signals in the signal line 14 (FIG. 1) will induce a current into the adjacent loop 18. If the Josephson device J1 connected in loop 18 is resistive in nature the current in the loop will depend not only upon the instantaneous value of current in the signal line 14 but also on the previous values of that current. When, however, the Josephson device J1 is switched to its superconducting state loop 18 will trap a quantity of current therein which is related to the current, at that instant of time, in the signal line 14. The Zappe apparatus then provides a second loop for measuring the level of current trapped in the first loop. Those of ordinary skill in the art will appreciate that to perform the measurement process, which takes a finite amount of time, the Josephson device J1 must remain superconducting. During this period, however, any changes in the current in signal line 14 will induce corresponding changes into the current in the loop 18. Therefore, to provide effective measurement of the current in line 14 at a predetermined instant of time, it is necessary for the signal in line 14 to be a single pulse which is separated from other signals by an amount of time which is at least equal to the time it takes for the measurement process.

Richards, expressly recognizes a similar limitation on his apparatus by reciting that the current in the gate conductor should be removed in order to set up a circulating current in the superconductive loop which is equal in magnitude to the original current.

Of course, if a user desires to employ the Zappe apparatus to measure a signal level of an isolated pulse or, can arrange his signal line to terminate the signal subsequent to the signal level it is desired to monitor, this apparatus will operate to trap in a superconducting loop a current from which can be measured the level of the current in the signal line. However, in the general case of a measurement problem a user does not have the happy circumstance of a single isolated pulse which he desires to measure or the alternative capacity to terminate the signal just subsequent to the occurrence of a signal to be measured. Rather, in the general measurement problem the user has a signal line on which is contained a continuous signal and the user desires to measure the signal level on this line at a predetermined repetition rate. Furthermore, the measurement apparatus which is available takes a finite period of time in which to perform the measurement process. Taking the specific case of analog digital conversion as a measurement process; although devices to perform this conversion are relatively fast they nevertheless do require a finite period of time in which the conversion takes place. Therefore, the user is faced with a problem of providing a circuit which is capable of sampling the current in the signal line at any predetermined instant of time and for maintaining the sampled level for a measurement interval regardless of variations in the actual signal line.

Although Crowe teaches a superconductive A/D converter he employs both hard and soft superconductors and it is not apparent that his teaching can be applied to a circuit with a single Josephson device as disclosed herein.

It is, therefore, one object of the present invention to provide an analog transducing circuit for switching an analog current signal from one of two parallel superconducting circuits to the other which is useful as an A/D converter or a samle and hold circuit.

It is another object of the present invention to provide a sample and hold circuit which is capable of sampling the current in a signal line and storing a quantity equal to the sampled signal at a predetermined instant of time. It is a further object of the present invention to provide a sampling circuit such as referred to above which is capable of maintaining the stored sample level for a predetermined measurement interval regardless of variations in the actual level of the signal subsequent to the predetermined sampling instant.

It is still a further object of the present invention to provide an apparatus capable of meeting the foregoing requirements and which is capable of responding in extremely short periods of time. A still further object of the present invention is to provide a superconductive circuit which meets the foregoing criteria which includes Josephson device therein which device is capable of being switched in periods of time on the order of $10^{-11}$ seconds.

SUMMARY OF THE INVENTION

These and other objects of the invention are achieved by providing a superconductive analog signal transducing circuit which includes first and second superconductive circuits connected to a pair of common terminals. The first superconductive circuit includes a Josephson device connected between said terminals and a means for applying an analog current signal is connected to one of the aforesaid terminals. The second of the superconductive circuits includes an inductance (which may be distributed) which is greater in value than the inductance of the Josephson device which is connected in the first superconductive circuit. Finally, means are provided for controlling the state of the Josephson device. In the sample and hold embodiment the means, when controlling the Josephson device in its resistive state will force the continuous current signal to flow through the second superconductive circuit and, when the control means switches the Josephson device to its superconductive state it will thereby allow the continuous current signal flowing in said second superconductive circuit to be maintained whereby variations in the continuous current signal will be passed by the first superconductive circuit, through the Josephson device, and will not affect the quantity of current flowing in the second superconductive circuit.

DETAILED DESCRIPTION OF A PREFERRED EMBODIMENT

Figure 1:
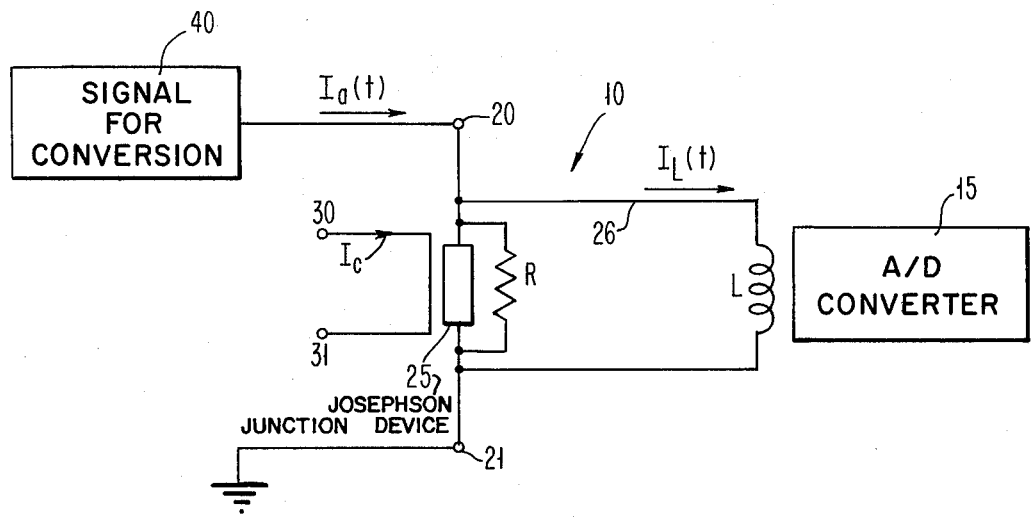
FIG. 1 is a part block and part schematic drawing illustrating apparatus for providing analog digital conversion and which includes the sample and hold circuit of my invention.

FIG. 1 discloses apparatus to provide for analog to digital conversion of an analog signal. For illustration purposes the analog signal is provided by a generator 40 in the form of a continuous current signal whose amplitude is to be converted to digital form. Those of ordinary skill in the art will understand that the generator 40 would not ordinarily be provided but, the remaining portion of the apparatus illustrated in FIG. 1 would be connected to some circuit in which it was desired to measure the current level at a particular point. Furthermore, the function of analog to digital conversion is but one example of a number of measurement processes which require sample and hold circuit and thus the sample and hold circuit of my invention is not restricted to operating with analog to digital conversion equipment but, instead, may be operated with any measurement apparatus which requires a sampled signal to be held for a predetermined interval in order for the measurement process to proceed. Before describing the apparatus in detail the general requirements of the sample and hold circuit will be briefly set forth. When measuring an analog signal one function of the sample and hold circuit is to select the level of the signal at the desired interval, i.e., the sampling function. The second function is to maintain this sampled level for a predetermined interval of time during which a measurement process is proceeding, i.e., the holding function. In many cases the holding function is complicated by the fact that the analog signal being measured will vary subsequent to the sampling interval and the sample and hold circuit must have capability of not responding to the subsequent variations in the analog signal otherwise, the measurement process will be contaminated by operating not on a single sampled signal level but instead, on a varying sample.

As shown in FIG. 1 the signal to be measured $I_a(t)$ is connected to an input terminal 20. Conveniently, the output terminal 21 may be grounded. Connected between the input and output terminals 20 and 21 is a superconductive circuit, i.e., a circuit which is composed of materials which will be superconductive at an operating temperature. Connected in this circuit is a Josephson device 25. FIG. 1 illustrates that the Josephson device 25 is shunted by a resistor R since a resistance is generally needed to assure that the Josephson device is critically damped. Although this resistor R is preferable it is not necessary and the resistance may be introduced by means other than connecting a resistor R in parallel with the Josephson device. A second superconductive circuit 26 is also connected between the input and the output terminals 20 and 21. The second superconductive circuit includes an inductance L connected therein. Although the inductance L is illustrated in FIG. 1 as a lumped element generally the inductance L is intended to represent the distributed inductance in the second superconductive circuit 26.

As shown in FIG. 1 the second superconductive circuit may be coupled to an analog to digital converter 15 and, conveniently, such coupling can be magnetic. Although an analog to digital converter 15 is specifically illustrated in FIG. 1 those of ordinary skill in the art will understand that in general the second superconductive circuit 26 can be coupled to any measuring instrument. Preferably the measuring instrument, or utilization device, is also superconductive at an operating temperature.

Located adjacent the Josephson device 25 is a control conductor connected between terminals 30 and 31. A control current $I_c$ flows in this circuit and controls the state of the Josephson device 25.

Figure 3:
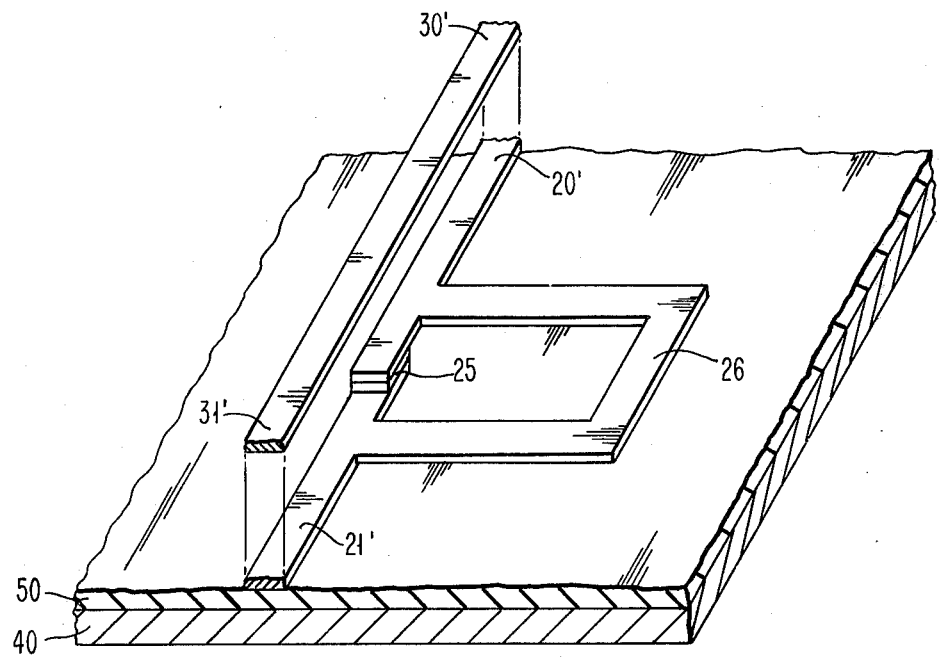
FIG. 3 is an isometric view of one embodiment of the sample and hold circuit of my invention.

FIG. 3 illustrates the physical appearance of the sample and hold circuit in accordance with my invention. Like reference characters in FIG. 3 refer to the identical apparatus shown in FIG. 1. Thus, on the ground plane 40 an insulated layer 50 is deposited. On this insulated layer 50 is deposited the conductors 20', 21' and 26. A Josephson device 25 is connected between the conductors 20' and 21'. A control conductor is provided between terminals 30' and 31'. Since only a portion of the circuits are illustrated in FIG. 3 the primed elements may be connected to the unprimed terminals, as shown in FIG. 1. The control conductor orientation may be varied in accordance with the topography of the circuits and may be separated from the Josephson device by an insulating layer.

In operation, the control conductor normally carries a current so as to maintain the Josephson device 25 in its resistive state. As a consequence substantially all of the current to be measured $I_a(t)$ flows through the second superconducting circuit 26. At the instant it is desired to sample the current $I_a(t)$ the current in the control conductor is reduced to zero to thereby switch the Josephson device to its superconducting state. Since the inductance of the Josephson device is smaller than the inductance in the second superconductive circuit 26 the current which was flowing through the second superconductive 26 is maintained at a level it was at the time the Josephson device was switched to its superconducting state. However, current variations in the analog signal $I_a(t)$ flow through the superconducting device 25. As a result, so long as the Josephson device 25 is maintained in its superconducting state a current flows in a second superconductive circuit 26 which is equal to the current which was flowing therein at the time the Josephson device 25 was switched to its superconducting state. In this fashion, the sampled current level is maintained during the measuring interval. At the conclusion of the measurement interval the Josephson device 25 is again switched to its normal state by the appearance on the control current. In this fashion the current in the second superconducting circuit 6 rapidly attains the level of the analog signal current $I_a(t)$ which is to be measured. As soon as substantially all the siganl current $I_a(t)$ is again flowing in the superconducting circuit 26, the sample and hold circuit 10 is capable of taking another sample.

Figures 2A, 2B, 2C:
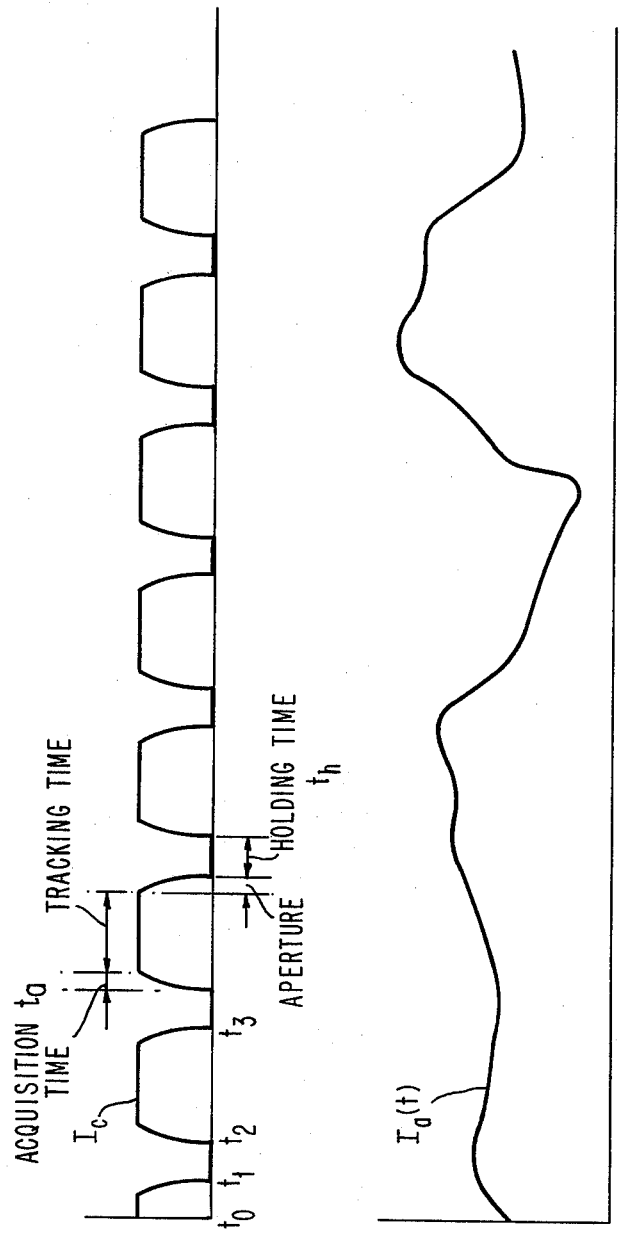
FIGS. 2a, 2b and 2c are sample waveforms illustrating the operation of the sample and hold circuit of my invention.

The waveforms representing this operation is illustrated in FIGS. 2a through 2c. FIG. 2a illustrates a typical waveform for the control current. FIG. 2b is intended to represent any analog signal current $I_a(t)$ which is desired to be measured. FIG. 2c represents the current flowing in the second superconductive circuit. At time $t_0$ the presence of the control current assures that the Josephson device is in its normal state thus, at this time the current in the second superconducting circuit $I_1(t)$ equals $I_a(t)$ which is the current to be measured. At time $t_1$ the control current is reduced to zero thus switching the Josephson device 25 to its superconducting state. Thus, at time $t_1$ the current in the second superconducting circuit $I_1(t)$ is sampled. Since the control current is maintained at a zero level until time $t_2$ the current in the second superconducting circuit from time $t_1$ to $t_2$ is constant. $I_1(t)$ is maintained, regardless of the variations in the analog signal current $I_a(t)$ and these variations pass through the Josephson device 25. At the conclusion of the measuring interval at $t_2$ the control switches the Josephson device to its normal state and as a result the current in the second superconducting circuit 26 now tracks the current to be measured. The acquisition time $t_a$ is defined as the time required for the second superconducting circuit to be updated to the current value of the current to be measured. The acquisition time is determined by the time constant L/R of the circuit. Typically one can contemplate an inductance L of $10^{-12}$ h and an R which is approximately $10^{-1}$ ohms. Thus, an acquisition $t_a$ on the order of 10 pico-seconds is possible.

The holding time $t_h$ is defined as the time during which the sample can be held at a constant value. In principal this is indefinite. The stability of the held signal is the ratio of the loop inductance L, i.e., the inductance in the second superconducting circuit and the inductance of the Josephson device.

Although I have referred to the Josephson device as being switched between a normal or resistive and superconductive state those of ordinary skill in the art will understand that some current will flow through the Josephson device even in its resistive state. To the extent that current flows in the Josephson device in its resistive state, of course, this current will result in a difference between the current to be measured $I_a(t)$ and the current flowing in the second superconducting circuit. Therefore, in order to avoid measurement errors caused by this current the Josephson device should be so designed that this current is less than one half the least significant bit which is expected to result from the measurement process. Likewise, when the Josephson device switches to its superconducting state the apparatus must be arranged so that the continuous current signal to be measured $I_a(t)$ does not exceed the maximum Josephson current for the device.

It will therefore be appreciated that the sample and hold circuit of my invention is capable of sampling a continuous analog current signal at any predetermined instant of time and is further capable of maintaining a sampled signal level regardless of variations in the continuous analog current signal so that a measurement process can proceed during a measurement interval on a constant sampled level. This operation is effected without requiring the continuous analog signal to be reduced to zero and without requiring the sampled signal level to be of the pulse type or repetitive in nature.

Figure 4:
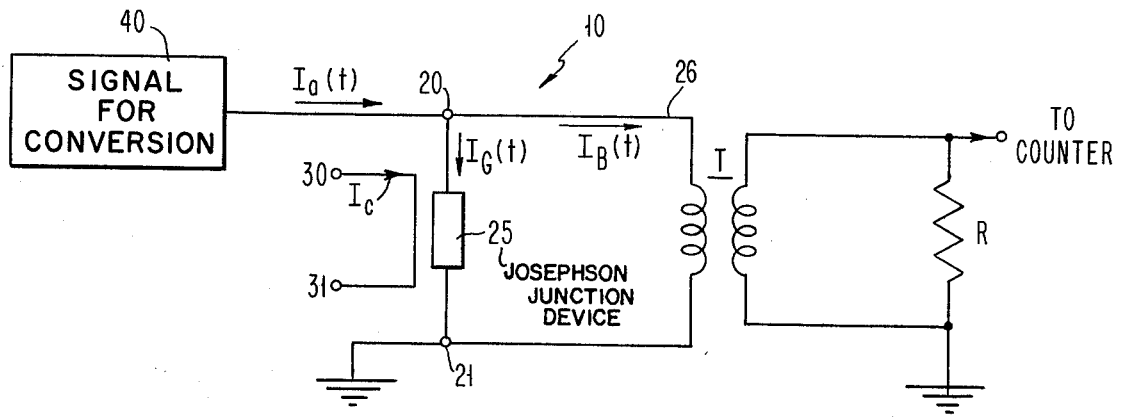
FIG. 4 is a schematic for effecting A/D conversion.

FIG. 4 illustrates essentially the same circuit as that shown in FIG. 1 which can be employed to perform an analog/digital conversion process. As in FIG. 1, a signal for conversion is provided by a signal generator 40. This signal, $I_a(t)$ flows into an input terminal 20. Two superconductive circuits are connected to input terminal 30. At first superconductive circuit includes a Josephson device 25 connected between terminals 20 and 21. A second superconductive circuit 26 is also connected between the same two terminals. A control means comprising a conductor is connected between terminals 30 and 31 to control the state of the Josephson device 25 by having a control current $I_c$ flowing therein. In this application, however, the bias is fixed, and indeed the control current $I_c$ may be zero as will be explained in more detail hereinafter. We will refer to the inductance of the first superconductive circuit device as $L_g$ since the greater portion of this inductance is contributed by the Josephson device 25 itself. The inductance of the second superconductive circuit 26, or the branch circuit, will be referred to hereinafter as $L_b$, and although shown in FIG. 4 as a lumped element this inductance may actually be distributed in the branch circuit. Desirably $L_b$ is greater than $L_g$ and a ratio $L_g/L_b$ of approximately 0.02 is preferable. The analog signal which is to be converted to digital form comprises the analog current $I_a(t)$ which flows into terminal 20 and, as shown in FIG. 4 is provided by the signal generator 40. The threshold current of Josephson device 25 $I_{max}$ is controlled, by proper bias, proper design, or a combination of these two factors, to be equal to $I_n/n$ where $I_n$ denotes the maximum analog signal magnitude and n indicates the desired resolution of the converter. In order to provide greater accuracy the converter admits and expels magnetic flux from the loop comprising the two superconductive circuits in amounts of a single flux quantum $\phi_o$ equal to $2 \cdot 10^{-15}$ Vsec. To assure that magnetic flux is admitted and expelled in increments of a single quantum the total loop inductance $L_g$ plus $L_b$ is approximately equal to $\phi_o/I_{max}$.

In operation the bias of the Josephson device limits the maximum Josephson current to $I_{max}$. As has been mentioned above this bias can be provided either by a constant $I_c$, through proper design of the physical parameters and materials of the Josephson device, or a combination of the control current and the device design. In any event, as the analog signal current $I_a(t)$ increases in magnitude it will initially flow substantially only in the first superconducting circuit, that is through the Josephson device 25. More particularly, approximately 98 percent of the analog input current will flow in the first superconducting circuit for the inductance ratio cited previously. As $I_g(t)$ reaches $I_{max}$, however, the Josephson device will switch to the resistive state and that will force substantially all of the analog signal current to flow in the second superconducting circuit. As soon as the analog signal current is no longer flowing through the first superconducting circuit, however, the Josephson device will switch back to the superconducting state. At this point in time, $I_b(t)$ will be substantially equal to $I_{max}$ and $I_g(t)$ will be substantially zero. At this time, if the analog signal current further increases in value, the current over and above $I_{max}$ will flow in the first superconducting circuit again. As the value of $I_g(t)$ again reaches $I_{max}$ the Josephson device 25 will again switch to the resistive state so that $I_b(t)$ will now equal $2I_{max}$. As the analog signal current continues to increase in value similar operations occur, i.e., the Josephson device 25 will switch from the superconductive to the resistive state each time the current through it reaches $I_{max}$ and, immediately thereafter switch back to the superconducting state. Each time the Josephson device 25 goes through a cycle of switching to the resistive state and then switching back to the superconducting state, a single flux quantum is trapped in the loop.

When the analog signal begins to fall in magnitude, the trapped flux forces a current to flow through the Josephson device 25 in the opposite direction. As the analog signal continues to decrease in value the current flowing through the Josephson device 25 in the opposite direction increases until $I_g$ equals $-I_{max}$. At this point, the Josephson device 25 will switch again to the resistive state. In this case, however, the voltage developed across the device will be of opposite polarity and a single flux quantum will be released from the loop. At this point, the Josephson device will again switch back to the superconducting state. This process will be repeated as the analog signal continues to decrease in value.

The incremental addition or release of a flux quantum is governed by the L/R time constant of the loop. Generally this action can be made much faster than the changes in the analog signal level. As a result, by differentiating $I_b(t)$ flowing in the second superconducting circuit the occurrence of flux admission or expulsion can be detected.

Apparatus to perform this function is schematically illustrated in FIG. 4 as comprising a transformer T. The transformer T has a primary winding which is included in the second superconducting circuit and a secondary winding magnetically coupled to the primary winding. The secondary winding will provide short pulses of one polarity for an incremental rise in the analog signal evidenced by admission of a flux quantum to the loop. Correspondingly, decreases of the analog signal will generate pulses of the opposite polarity as evidenced by expulsion of a flux quantum from the loop. These pulses can be amplified to count up and down a $2^N$ binary counter or to shift the contents of a shift register to the right or left respectively in an N bit shift register. As a result, discrete digital values related to the analog signal level are contained in the counter or shift register at all times.

Figure 5:
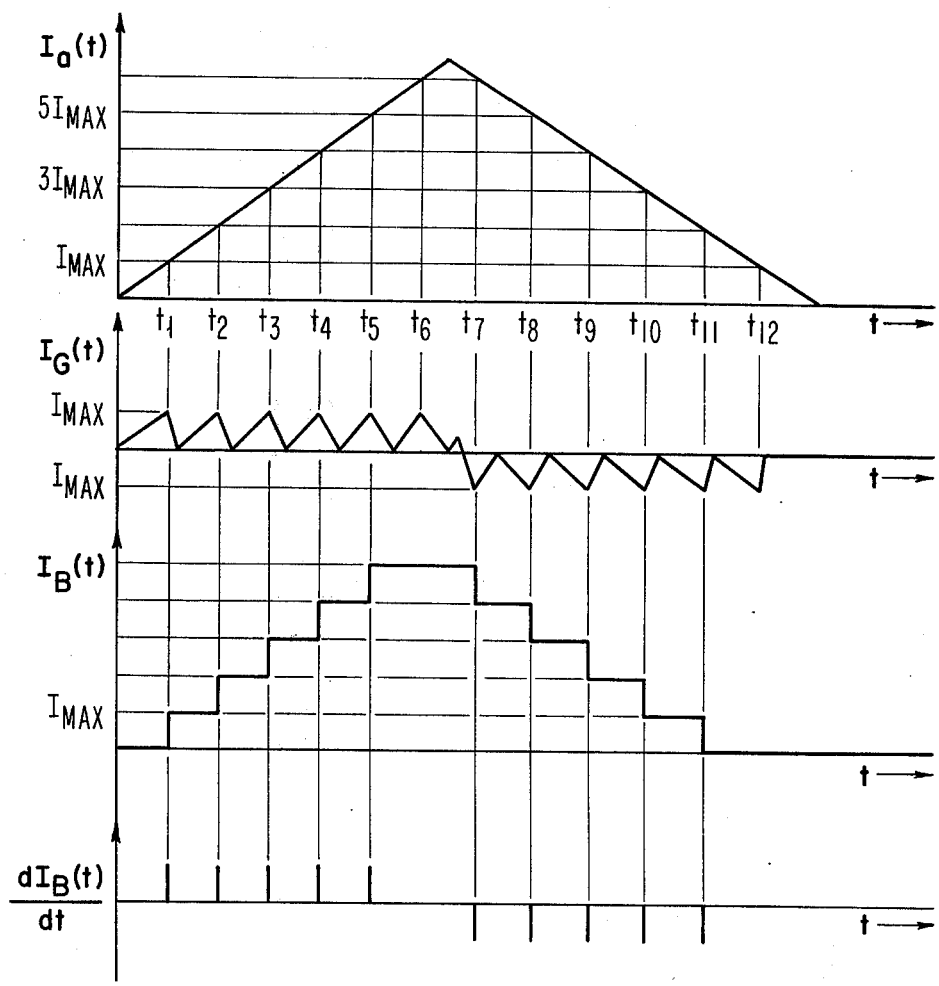
FIG. 5 shows representative waveforms in the course of operation of the circuit of FIG. 4.

The operation of the circuit schematically illustrated in FIG. 4 can be explained in more detail with reference to the illustrative waveforms shown in FIG. 5. For the purposes of discussing this operation FIG. 5 illustrates the waveform of a representative analog current signal $I_a(t)$ as being triangular with respect to time. The absicca is calibrated in units of $I_{max}$. Also illustrated in FIG. 5 are representative waveforms for $I_g(t)$, $I_b(t)$ and the derivative, with respect to time, of $I_b(t)$. As the analog signal current level increases the current through the Josephson device $I_g(t)$ correspondingly increases up to time T1 at which point $I_g(t)$ equals $I_{max}$.

At this point the Josephson device 25 switches to the resistive state which forces the analog signal current to flow through the second superconducting circuit. Thus, at time T1, $I_b(t)$ is subjected to a step increase of current to approximately $I_{max}$ and, $I_g(t)$ drops to substantially zero. However, since the analog signal current $I_a(t)$ continues to increase $I_g(t)$ likewise continues to increase while $I_b(t)$ remains constant at $I_{max}$. When the analog signal level has reached $2I_{max}$ a current of $I_{max}$ will be flowing in the Josephson device. This causes it again to switch to the resistive state thus forcing $2I_{max}$ to flow in the second superconducting circuit. Thus, the current in the second superconducting circuit is incremented in steps of $I_{max}$ while the current through the Josephson device continually increases from zero to $I_{max}$ and then drops back to zero.

Subsequent to time $T_6$ and prior to time $T_7$ the analog signal $I_a(t)$ reaches the maximum and then begins decreasing. The current through the Josephson device $I_g(t)$ reflects this variation by itself reaching a maximum at this time and then decreasing until, prior to time $T_7$, $I_g(t)$ begins flowing in the opposite direction and, in increasing magnitude. At time $T_7$, $I_g(t)$ equals $-I_{max}$. This, of course, results in switching the Josephson device to its resistive state. However, the voltage across the Josephson device is now of opposite polarity and therefore a flux quantum is released from the loop. This is reflected in the step change in $I_b(t)$ at time $T_7$.

An output signal can be obtained for a counter by magnetically coupling to either the first or the second of the superconductive circuits. FIG. 4 illustrates magnetic coupling to the second superconductive circuit by providing a secondary winding magnetically coupled to the secondd superconductive circuit through which $I_b(t)$ flows. The voltage induced in a secondary winding, or course, will be the time derivative of the flux linking the secondary winding. Furthermore, the flux linking the secondary winding will be proportional to the current flowing in the second superconductive circuit, i.e., $I_b(t)$. Therefore, the voltage induced in the secondary will be proportional to the quantity $dI_b(t)/dt$. The waveform of this function is also illustrated in FIG. 5.

Alternatively, the current in the first superconductive circuit, $I_g(t)$ can be employed to provide an output which is related to the digital value of the analog input signal. A similar type of magnetic coupling can be employed for this output signal. However, reference to FIG. 5, and more particularly, to the waveform of $I_g(t)$ illustrates that the time derivative of $I_g(t)$ will have an additional or anomalous pulse representing the change in slope of the analog signal, between times $T_6$ and $T_7$. This anomaly will be present for any input signal which first rises and then falls. Since this is a systematic error a logic circuit can modify the output to produce a correct count. For instance, the first count-down pulse, after one or more count-up pulses can be arranged to count-down twice and thus eliminate the anomalous count-up pulse.

It should thus be apparent that the apparatus disclosed herein provides an analog waveform transducing circuit which includes first and second superconductive circuits connected in parallel. A Josephson tunnelling device is connected in said first superconductive circuit and means are provided for applying an analog signal to the parallel combination of superconductive circuits. Means are also provided which are coupled to the Josephson device for switching the device to thereby transfer at least a portion of the analog signal to a second superconductive circuit. Furthermore, means may be provided which are coupled to either the first or the second of the superconductive circuits for producing an output signal.

In another light the apparatus can be conceived of as including an Josephson device disposed in a superconducting path to which are connected means for trapping a single flux quantum or plural flux quanta with an analog signal connected to the Josephson device and means for switching said device to transfer the analog signal, at the time of switching, to the trapping means and to reset the Josephson device to thereby trap at least a single flux quantum.

What I claim is:

1. An analog waveform transducing circuit including at least a pair of circuits responsive to an analog signal input in the form of a current for transferring at least a predetermined portion of said input current to said second circuit comprising:
   a first superconducting circuit including a Josephson device connected between input and output terminals,
   a second superconductive circuit connected in parallel with said first circuit and having an inductance greater than that of said first circuit,
   an analog current signal source,
   means for applying said analog signal to said input terminal, and
   means coupled to said device for switching said device to transfer at least a portion of said analog signal to said second circuit.

2. An analog waveform transducing circuit according to claim 1 further including means coupled to at least one of said first and second circuits for obtaining an output signal therefrom.

3. A superconductive sample and hold circuit for maintaining a particular current level regardless of variations in the input to said circuit comprising,
   a first superconductive circuit connected between input and output terminals,
   a Josephson device connected in said first superconductive circuit,
   an analog current signal source,
   means for applying said analog signal to said input terminal,
   a second superconductive circuit connected between said input and output terminals and adapted to be coupled to utilization means, said second superconductive circuit having an inductance greater than the inductance of said Josephson device,
   and control means magnetically coupled to said Josephson device for forcing said analog signal to flow through said second superconductive circuit and for,
   at times, switching said Josephson device to a superconductive state to thereby allow at least some of said analog signal to flow in said Josephson device, whereby current in said second superconductive circuit will track said analog signal when said Josephson device is resistive and said current in said second superconductive circuit will be maintained, when said Josephson device is superconductive, at a value which was flowing in said second superconductive circuit when said Josephson device becomes superconductive.

4. The apparatus of claim 3 wherein said control means comprises a control conductor.

5. The apparatus of claim 3 in which said second superconductive circuit is magnetically coupled to said utilization means.

6. The apparatus of claim 3 wherin said utilization means comprises an analog to digital converter.

7. An analog waveform transducing circuit responsive to an analog signal input in the form of a current for transferring at least a predetermined portion of said input current comprising:
 a Josephson tunnelling device disposed in a superconducting path,
 means disposed in parallel with said device for trapping at least a single flux quantum,
 an analog current signal source,
 means for applying said analog signal to said Josephson tunnelling device, and
 means coupled to said device for switching said device to transfer the value of said analog signal, at the time of switching, to said trapping means and to reset said device such that at least a single flux quantum is trapped in said trapping means.

8. An analog waveform transducing circuit according to claim 7 further including means coupled to at least one of said superconducting path and said trapping means for obtaining an output therefrom.

9. An analog waveform transducing circuit according to claim 7 further including means coupled to said trapping means responsive to the number of flux quanta trapped in said trapping means.

10. An analog waveform transducing circuit according to claim 7 wherein said means for trapping is a loop including inductance.

11. An analog waveform transducing circuit according to claim 7 wherein said means coupled to said circuit for switching includes a pulse source of control current and a control line electromagnetically coupled to said device.

12. An analog waveform transducing circuit according to claim 10 wherein said inductance is greater than the inductance of said device.

13. An analog waveform transducing circuit including at least a pair of circuits responsive to an analog signal input in the form of a current for transferring at least a predetermined portion of said input current to said second circuit comprising:
 a first superconducting including a Josephson device connected between an input and output terminal,
 a second superconducting circuit connected in parallel with said first circuit and having an inductance greater than that of said first circuit,
 an analog current signal source,
 means for applying said analog signal to said input terminal, and
 means coupled to said device for switching said device to transfer at least a portion of said analog signal between said circuits.

14. An analog waveform transducing circuit according to claim 13 further including means coupled to at least one of said first and second circuits for obtaining an output signal therefrom.

15. An analog waveform transducing circuit including at least a pair of circuits responsive to an analog signal input in the form of a current for transferring at least a predetermined portion of said input current between said circuits comprising:
 a first superconducting circuit including a Josephson device connected to input and output terminals,
 a second superconducting circuit connected in parallel with said first circuit and having an inductance greater than that of said first circuit,
 an analog current signal source,
 means for applying said analog signal to said input terminal, and
 means coupled to said device for switching said device to change the quantity of flux in said second circuit by at least a single flux quantum.

16. An analog waveform transducing circuit according to claim 15 further including means coupled to at least one of said first and second circuits for obtaining an output signal therefrom.

17. An analog waveform transducing circuit responsive to an analog signal input in the form of a current for transferring at least a predetermined portion of said input current comprising:
 a Josephson tunnelling device disposed in a superconducting path,
 means disposed in parallel with said device for trapping at least a single flux quantum,
 an analog current signal source,
 means for applying said analog signal to said Josephson tunnelling device, and
 means coupled to said device for switching said device to change the flux of said trapping means by at least a single flux quantum.

18. An analog waveform transducing circuit according to claim 17 further including means coupled to at least one of said superconducting paths and said trapping means for obtaining an output therefrom.

19. An analog waveform transducing circuit according to claim 17 further including means coupled to said trapping means responsive to the number of flux quantra trapped in said trapping means.

20. An analog waveform transducing circuit according to claim 17 wherein said means for trapping is a loop including inductance.

21. An analog waveform transducing circuit according to claim 17 wherein said means coupled to said device for switching includes a pulse souce of control current and a control line electromagnetically coupled to said device.

22. An analog waveform transducing circuit according to claim 20 wherein said inductance is greater than the inductance of said device.

* * * * *

UNITED STATES PATENT AND TRADEMARK OFFICE
CERTIFICATE OF CORRECTION

PATENT NO. : 3,983,419
DATED : September 28, 1976
INVENTOR(S) : Frank F. Fang

It is certified that error appears in the above-identified patent and that said Letters Patent are hereby corrected as shown below:

In column 1, line 57, change "cryotons" to --cryotrons--;

on line 59, delete one "a".

In column 7, line 16, change "30" to --20--.

In column 9, line 34, correct spelling of "second".

In column 10, line 16, delete "a pair of" and insert therefor --first and second superconductive--.

in line 20, delete "a" and insert therefor --said--, change "superconducting" to --superconductive--;

in line 23, delete "a" and insert therefor --said--;

in line 26, delete "an" and "," and follow "source" with lines 27 and 28.

in line 43, delete "an" and "," and follow "source" with lines 44 and 45.

In column 11, line 14 delete "an" and ",", and follow "source with lines 15 and 16.

in line 42, delete "a pair of" and insert therefor --first and second superconducting--;

in line 46, after "second" insert --superconducting-- .

in line 47, insert --circuit-- after "superconducting".

UNITED STATES PATENT AND TRADEMARK OFFICE
CERTIFICATE OF CORRECTION

PATENT NO. : 3,983,419
DATED : September 28, 1976
INVENTOR(S) : Frank F. Fang

It is certified that error appears in the above-identified patent and that said Letters Patent are hereby corrected as shown below:

in line 51, column 11, delete "an" and after "source" insert lines 52 and 53.

In column 12, line 15, delete "an" and "," and follow "source" with lines 16 and 17.

in line 33, delete "an" and "," and follow "source" with lines 34 and 35.

in lines 45 and 46, correct the spelling of "quanta".

Signed and Sealed this

Eighth Day of March 1977

[SEAL]

Attest:

RUTH C. MASON
*Attesting Officer*

C. MARSHALL DANN
*Commissioner of Patents and Trademarks*